United States Patent
Lee et al.

(10) Patent No.: US 10,147,709 B2
(45) Date of Patent: Dec. 4, 2018

(54) LIGHT EMITTING MODULE

(71) Applicant: Genesis Photonics Inc., Tainan (TW)

(72) Inventors: Hao-Chung Lee, Tainan (TW); Yu-Feng Lin, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/785,399

(22) Filed: Oct. 16, 2017

(65) Prior Publication Data
US 2018/0040594 A1 Feb. 8, 2018

Related U.S. Application Data

(63) Continuation of application No. 14/737,503, filed on Jun. 12, 2015, now abandoned.

(30) Foreign Application Priority Data

Jul. 14, 2014 (TW) .............................. 103212473 U

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/56* (2013.01); *H01L 33/60* (2013.01);
(Continued)

(58) Field of Classification Search
CPC ......... H01L 33/50; H01L 33/54; H01L 33/56; H01L 33/60; H01L 33/62; H01L 33/64;
(Continued)

(56) References Cited

U.S. PATENT DOCUMENTS

| 8,896,199 B2* | 11/2014 | Ito | H01L 33/505 |
| | | | 313/502 |
| 2011/0001148 A1* | 1/2011 | Sun | H01L 33/60 |
| | | | 257/88 |

(Continued)

FOREIGN PATENT DOCUMENTS

| CN | 101044632 | 9/2007 |
| CN | 101577304 | 11/2009 |

(Continued)

OTHER PUBLICATIONS

"Office Action of China Counterpart Application," dated May 24, 2018, p. 1-p. 6.

*Primary Examiner* — Peniel M Gumedzoe
(74) *Attorney, Agent, or Firm* — JCIPRNET

(57) ABSTRACT

A light emitting module including a light emitting device package structure and a heat dissipation structure is provided. The light emitting device package structure includes light emitting devices, a patterned reflective element and a patterned conductive layer. The patterned reflective element is disposed around side surfaces of the light emitting devices and exposes a first bottom surface of a first pad and a second bottom surface of a second pad. The patterned conductive layer is disposed on the first bottom surface of the first pad and the second bottom surface of the second pad. The light emitting devices are electrically connected to each other in a series connection, a parallel connection or a series-parallel connection through the patterned conductive layer. The heat dissipation structure is disposed below the light emitting device package structure and includes a heat dissipation unit and a patterned circuit layer disposed on the heat dissipation unit.

11 Claims, 1 Drawing Sheet

(51) Int. Cl.
    *H01L 33/60*    (2010.01)
    *H01L 33/64*    (2010.01)
    *H01L 33/56*    (2010.01)

(52) U.S. Cl.
    CPC ............ *H01L 33/62* (2013.01); *H01L 33/644* (2013.01); *H01L 2924/0002* (2013.01)

(58) Field of Classification Search
    CPC . H01L 33/644; H01L 25/075; H01L 25/0753; H01L 2924/0002
    See application file for complete search history.

(56) References Cited

U.S. PATENT DOCUMENTS

2012/0261700 A1\* 10/2012 Ooyabu ................ H01L 33/46
                                                            257/98
2015/0155450 A1\*  6/2015 Oka .................... H01L 33/504
                                                            257/98

FOREIGN PATENT DOCUMENTS

| CN | 102916118 | 2/2013 |
| CN | 103165800 | 6/2013 |

\* cited by examiner

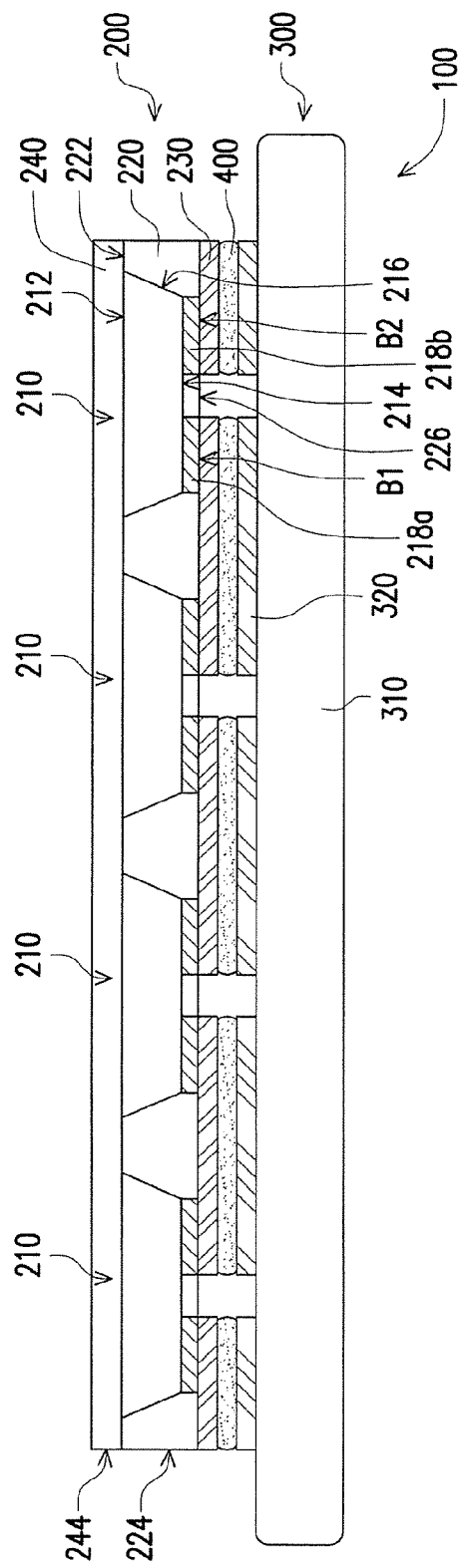

LIGHT EMITTING MODULE

CROSS-REFERENCE TO RELATED APPLICATION

This application is a continuation application of and claims the priority benefit of U.S. application Ser. No. 14/737,503, filed on Jun. 12, 2015, now pending, which claims the priority benefit of Taiwan application serial no. 103212473, filed on Jul. 14, 2014. The entirety of each of the above-mentioned patent applications is hereby incorporated by reference herein and made a part of this specification.

BACKGROUND OF THE INVENTION

Field of the Invention

The invention relates to a light emitting module, and particularly relates to a light emitting module having a good heat dissipation effect and capable of reducing a risk of circuit break.

Description of Related Art

Generally, when a light emitting diode (LED) emits a light with a high luminance, a large amount of heat is produced. If the heat cannot escape and is accumulated in the LED, a temperature of the LED is continuously increased. In this case, the luminance of the LED is probably decreased due to overheat and a service life of the LED is decreased, or even the LED is permanently damaged. Therefore, a current light source module adopting the LEDs is generally configured with a heat sink to dissipate the heat of the LEDs.

However, in the conventional LED light source module, the LEDs are respectively configured on a circuit board after package cutting, and serial-parallel connections of the LEDs are implemented through an existing circuit layout of the circuit board, and then the circuit board carrying the LEDs is disposed on the heat sink. However, after the circuit layout on the circuit board is completed, the serial-parallel connections of the LEDs cannot be easily modified, which is lack of flexibility in application. Moreover, since the circuit board is generally configured with an insulation layer to achieve an insulation effect between different circuit layers, as the insulation layer is a poor conductor of heat, a rate that the heat of the LEDs is conducted to the heat sink through the circuit board is adversely influenced, which decreases heat dissipation efficiency of the LED light source module.

SUMMARY OF THE INVENTION

The invention is directed to a light emitting module, which has a larger heat dissipation area and has a good heat dissipation effect.

The invention provides a light emitting module including a light emitting device package structure and a heat dissipation structure. The light emitting device package structure includes a plurality of light emitting devices, a patterned reflective element and a patterned conductive layer. Each of the light emitting devices has an upper surface and a lower surface opposite to each other, a side surface connecting the upper surface and the lower surface and a first pad and a second pad located on the lower surface and separated from each other. The patterned reflective element is disposed around the side surfaces of the light emitting devices and exposes a first bottom surface of the first pad and a second bottom surface of the second pad of each of the light emitting devices. The patterned conductive layer is disposed on the first bottom surface of the first pad and the second bottom surface of the second pad of each of the light emitting devices. The light emitting devices are electrically connected to each other in a series connection, a parallel connection or a series-parallel connection through the patterned conductive layer. The heat dissipation structure is disposed below the light emitting device package structure and includes a heat dissipation unit and a patterned circuit layer disposed on the heat dissipation unit. The light emitting device package structure is electrically connected to the patterned circuit layer through the patterned conductive layer. Heat produced by the light emitting devices is transferred to the heat dissipation unit through the patterned conductive layer and the patterned circuit layer.

In an embodiment of the invention, the light emitting devices are, arranged in an array.

In an embodiment of the invention, the heat dissipation unit includes a ceramic substrate or a heat sink.

In an embodiment of the invention, the light emitting module further includes a molding compound disposed on the upper surfaces of the light emitting devices, where the molding compound includes a transparent molding compound or a molding compound doped with phosphor.

In an embodiment of the invention, each of the light emitting devices is a flip-chip light emitting device.

In an embodiment of the invention, a top surface of the patterned reflective element is aligned with the upper surface of each of the light emitting devices.

In an embodiment of the invention, a first circumferential surface of the patterned reflective element is aligned with a second circumferential surface of the molding compound.

In an embodiment of the invention, the first bottom surface of the first pad and the second bottom surface of the second pad of each of the light emitting devices are aligned with a bottom surface of the patterned reflective element.

In an embodiment of the invention, reflectivity of the patterned reflective element is at least greater than 90%.

In an embodiment of the invention, the light emitting module further includes an adhesive layer disposed between the patterned conductive layer of the light emitting device package structure and the patterned circuit layer of the heat dissipation structure.

According to the above descriptions, the patterned conductive layer is configured on the pads of the light emitting devices of the light emitting device package structure, and besides that the light emitting devices are electrically connected to each other in the series connection, the parallel connection or the series-parallel connection through the patterned conductive layer to decrease a manufacturing cost and increase application flexibility, a contact area of electrodes of the light emitting devices is also increased through the patterned conductive layer. Moreover, the light emitting devices can be electrically connected to the patterned circuit layer of the heat dissipation structure through the patterned conductive layer, and the heat produced by the light emitting devices is transferred to the heat dissipation unit through the patterned conductive layer and the pattered circuit layer. In this way, the light emitting module of the invention has a larger heat dissipation area to effectively prevent circuit break, and a combining procedure between the light emitting device package structure and the heat dissipation structure is simplified, which avails decreasing a production cost.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view of a light emitting module according to an embodiment of the invention.

DESCRIPTION OF EMBODIMENTS

FIG. 1 is a cross-sectional view of a light emitting module according to an embodiment of the invention. Referring to FIG. 1, the light emitting module 100 includes a light emitting device package structure 200 and a heat dissipation structure 300. The light emitting device package structure 200 includes a plurality of light emitting devices 210, a patterned reflective element 220, a patterned conductive layer 230 and a molding compound 240. The heat dissipation structure 300 is disposed below the light emitting device package structure 200, and includes a heat dissipation unit 310 and a patterned circuit layer 320 disposed on the heat dissipation unit 310.

In detail, each of the light emitting devices 210 has an upper surface 212 and a lower surface 214 opposite to each other, a side surface 216 connecting the upper surface 212 and the lower surface 214 and a first pad 218a and a second pad 218b located on the lower surface 214 and separated from each other. The patterned reflective element 220 is disposed around the side surfaces 216 of the light emitting devices 210, where the patterned reflective element 220 exposes a first bottom surface B1 of the first pad 218a and a second bottom surface B2 of the second pad 218b of each of the light emitting devices 210. The patterned conductive layer 230 is disposed on the first bottom surface B1 of the first pad 218a and the second bottom surface B2 of the second pad 218b of each of the light emitting devices 210. The light emitting devices 210 are electrically connected to each other in a series connection, a parallel connection or a series-parallel connection through the patterned conductive layer 230. The molding compound 240 is disposed on the upper surfaces 212 of the light emitting devices 210 in a pattern, or as shown in FIG. 1, the molding compound 240 is continually disposed on the supper surfaces 212 of the light emitting devices 210 and a top surface 222 of the patterned reflective element 220. The light emitting device package structure 200 is electrically connected to the patterned circuit layer 320 through the patterned conductive layer 230. Particularly, the patterned conductive layer 230 and the patterned circuit layer 320 can be designed to be conformal, though the invention is not limited thereto. Therefore, the heat produced by the light emitting devices 210 can be transferred to the heat dissipation unit 310 through the patterned conductive layer 230 and the patterned circuit layer 320.

As shown in FIG. 1, the light emitting devices 210 of the present embodiment are substantially arranged in an array, for example, a 1×4 matrix, and through direct contact and electrical connections between the first pad 218a and the second pad 218b of the light emitting device 210 and the patterned conductive layer 230, the light emitting device package structure 200 having a serial loop (i.e. four-series) is formed. To be specific, the first pad 218a of one light emitting device 210 is electrically connected to the second pad 218b of another light emitting device 210 through the patterned conductive layer 230, and the first pad 218a of the another light emitting device 210 is electrically connected to the second pad 218b of still another light emitting device 210 through the patterned conductive layer 230, so as to form the light emitting device package structure 200 having the serial loop (i.e. four-series). Certainly, the invention is not limited to the aforementioned arrangement of the light emitting devices 210 and the circuit loop of the light emitting device package structure 200. In other embodiments that are not illustrated, those skilled in the art can arrange the light emitting devices in, for example, a 2×2 matrix, a 3×4 matrix, etc., according to an actual design requirement based on the description of the aforementioned embodiment, and achieve the light emitting package structure 200 having the required circuit loop (for example, two-series three-parallel, four-series one-parallel, etc.) through the configuration of the patterned conductive layer 230, which is still a technical pattern of the invention without departing from a protection scope of the invention. Therefore, compared to the conventional technique that a circuit layout is implemented on a circuit board, in the present embodiment, the light emitting devices 210 may form the required circuit loop through the patterned conductive layer 230, so as to enhance the application flexibility. Each of the light emitting devices 210 of the present embodiment is, for example, a flip-chip light emitting device, though the invention is not limited thereto.

Moreover, the patterned reflective element 220 of the present embodiment is substantially a structure formed integrally, and surrounds the side surfaces 216 of the light emitting devices 210, and directly covers the side surfaces 216 of the light emitting devices 210. Preferably, reflectivity of the patterned reflective element 220 of the present embodiment is at least greater than 90%. As shown in FIG. 1, the top surface 222 of the patterned reflective element 220 of the present embodiment is substantially aligned with the upper surface 212 of each of the light emitting devices 210. A first circumferential surface 224 of the patterned reflective element 220 is aligned with a second circumferential surface 244 of the molding compound 240. The first bottom surface B1 of the first pad 218a and the second bottom surface B2 of the second pad 218b of each of the light emitting devices 210 are aligned with a bottom surface 226 of the patterned reflective element 220 opposite to the top surface 222.

Moreover, the molding compound 240 is, for example, a transparent molding compound or a molding compound doped with phosphor. For example, in order to change a light color of the light emitting devices 210, the molding compound doped with phosphor can be adopted, where the phosphor is, for example, a yellow fluorescent powder, a red fluorescent powder, a green fluorescent powder, a blue fluorescent powder or a yttrium aluminum garnet fluorescent powder, which is still belong to the technical pattern of the invention without departing from the protection scope of the invention. Moreover, the heat dissipation unit 310 of the present embodiment is, for example, a ceramic substrate, a heat sink, or other suitable heat dissipation device having a good heat dissipation effect.

In order to increase a bonding force between the light emitting device package structure 200 and the heat dissipation structure 300, the light emitting module 100 of the present embodiment further includes an adhesive layer 400 disposed between the patterned conductive layer 230 of the light emitting device package structure 200 and the patterned circuit layer 320 of the heat dissipation structure 300. A material of the adhesive layer 400 is, for example, solder paste, silver paste, or other suitable material.

In the present embodiment, since the patterned conductive layer 230 is disposed on the first pads 218a and the second pads 218b of the light emitting devices 210, electrical connections between the light emitting devices 210 such as the series connection, the parallel connection or the series-parallel connection can be implemented by disposing the patterned conductive layer 230 on the first pads 218*a* and the second pads 218*b*. Namely, the series-parallel connection relationship between the light emitting devices 210 of the present embodiment is determined by a configuration position of the patterned conductive layer 230, which is different to the conventional technique that the series-parallel connection relationship between the light emitting devices is determined by the circuit layout of the circuit board. In other words, through the configuration of the patterned conductive layer 230, the light emitting devices 210 of the present embodiment may have a plurality of circuit loop designs of different patterns, such that the application of the invention can be wider and flexible. On the other hand, a contact area of the first pads 218*a* and the second pads 218*b* of the light emitting devices 210 of the present embodiment can be increased through the patterned conductive layer 230. In other words, the light emitting device package structure 200 of the present embodiment may have a larger electrode area, and when the light emitting device package structure 200 and the heat dissipation structure 300 are assembled to form the light emitting module 100, besides that a combining procedure between the light emitting device package structure 200 and the heat dissipation structure 300 is simplified to decrease the manufacturing cost, an alignment accuracy of the assembling is effectively increased.

Moreover, since the light emitting device package structure 200 of the present embodiment has the patterned reflective element 220, and the patterned reflective element 220 is directly disposed on the side surfaces 216 of the light emitting devices 210, the patterned reflective element 220 can reflect a lateral light of the light emitting device 210 to the forward, i.e. a light flux of the forward light of the light emitting devices 210 is increased, and a light flux of the lateral light of the light emitting devices 210 is decreased. In this way, besides that the light emitting module 100 of the present embodiment has good light emitting efficiency, a phenomenon of uneven color thereof is also mitigated, so as to achieve better light emitting uniformity. Moreover, since the light emitting devices 210 of the light emitting device package structure 200 are electrically connected to the patterned circuit layer 320 of the heat dissipation structure 300 through the patterned conductive layer 230, a circuit break phenomenon is effectively prevented. On the other hand, since the heat produced by the light emitting devices 210 of the light emitting device package structure 200 is directly transferred to an external environment through the patterned conductive layer 230 and the patterned circuit layer 320 via the heat dissipation unit 310, besides a larger heat dissipation area, the light emitting module 100 also has a good heat dissipation and heat conduction effect.

In summary, the patterned conductive layer is configured on the pads of the light emitting devices of the light emitting device package structure, and besides that the light emitting devices are electrically connected to each other in the series connection, the parallel connection or the series-parallel connection through the patterned conductive layer to decrease the manufacturing cost and increase application flexibility, a contact area of electrodes of the light emitting devices is also increased through the patterned conductive layer. Moreover, the light emitting devices can be electrically connected to the patterned circuit layer of the heat dissipation structure through the patterned conductive layer, and the heat produced by the light emitting devices is transferred to the heat dissipation unit through the patterned conductive layer and the pattered circuit layer. In this way, the light emitting module of the invention has a larger heat dissipation area to effectively prevent a circuit break, and a combining procedure between the light emitting device package structure and the heat dissipation structure is simplified, which avails decreasing a production cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting device, comprising:
    a carrier substrate having a patterned circuit layer formed thereon;
    at least one light emitting unit having a first pad and a second pad located on a lower surface thereof, and the light emitting unit disposed on the carrier substrate wherein the first pad and the second pad are electrically connected to the patterned circuit layer;
    a reflective element disposed on the carrier substrate and encapsulating the light emitting unit and exposing the first pad and the second pad and an upper surface of the light emitting unit, wherein an upper surface of the reflective element is flush with the upper surface of the light emitting unit, and the reflective element directly contacts the entirety of a side surface of the light emitting unit and has an inclined reflective surface toward the light emitting unit; and
    a molding layer disposed on the upper surface of the light emitting unit and the upper surface of the reflective element.

2. The light emitting device as claimed in claim 1, wherein the molding layer comprises a flat top surface.

3. The light emitting device as claimed in claim 1, wherein the molding layer comprises a wavelength conversion layer or a light transmissive layer without wavelength conversion function or a light transmissive layer for light scattering.

4. The light emitting device as claimed in claim 1, wherein the light emitting device has a flat lateral surface comprising a wavelength conversion layer and the reflective element.

5. The light emitting device as claimed in claim 1, further comprising an extensive conductive layer disposed between the first pad and the second pad of the light emitting unit and the patterned circuit layer.

6. The light emitting device as claimed in claim 5, wherein the extensive conductive layer comprising a first portion and a second portion respectively coupled to the first pad and the second pad, along a bottom surface of reflective element.

7. A light emitting device, comprising:
    at least one light emitting unit having a first pad and a second pad located on a lower surface thereof;
    a reflective element encapsulating the light emitting unit and exposing the first pad and the second pad and an upper surface of the light emitting unit, wherein an upper surface of the reflective element is flush with the upper surface of the light emitting unit, and the reflective element directly contacts the entirety of a side surface of the light emitting unit and has an inclined reflective surface toward the light emitting unit; and
    a molding layer disposed on the upper surface of the light emitting unit and the upper surface of the reflective element, wherein the light emitting device has a flat lateral surface comprising the molding layer and the reflective element.

8. The light emitting device as claimed in claim 7, further comprising an extensive conductive layer comprising a first portion and a second portion coupled to the first pad and the second pads respectively.

9. The light emitting device as claimed in claim 7, wherein the molding layer comprises a flat top surface.

10. The light emitting device as claimed in claim 7, wherein the molding layer comprises a wavelength conversion layer or a light transmissive layer without wavelength conversion function or a light transmissive layer for light scattering.

11. The light emitting device as claimed in claim 8, wherein the extensive conductive layer is disposed along a bottom surface of reflective element.

* * * * *